(12) United States Patent
Futamura et al.

(10) Patent No.: US 10,566,649 B2
(45) Date of Patent: Feb. 18, 2020

(54) LITHIUM ION SECONDARY BATTERY AND METHOD FOR MANUFACTURING THE SAME

(71) Applicant: SEMICONDUCTOR ENERGY LABORATORY CO., LTD., Atsugi-shi, Kanagawa-ken (JP)

(72) Inventors: Tomoya Futamura, Atsugi (JP); Tamae Moriwaka, Isehara (JP); Takahiro Kawakami, Atsugi (JP); Junpei Momo, Sagamihara (JP); Nobuhiro Inoue, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/608,439

(22) Filed: May 30, 2017

(65) Prior Publication Data

US 2017/0271713 A1   Sep. 21, 2017

Related U.S. Application Data

(60) Division of application No. 15/368,993, filed on Dec. 5, 2016, now Pat. No. 9,673,451, which is a
(Continued)

(30) Foreign Application Priority Data

Mar. 18, 2011 (JP) ................................ 2011-060197

(51) Int. Cl.
*H01M 10/0525* (2010.01)
*H01M 4/136* (2010.01)
(Continued)

(52) U.S. Cl.
CPC ......... *H01M 10/0525* (2013.01); *H01M 4/13* (2013.01); *H01M 4/136* (2013.01);
(Continued)

(58) Field of Classification Search
None
See application file for complete search history.

(56) References Cited

U.S. PATENT DOCUMENTS 6,723,470 B2   4/2004   Barker et al.
6,884,544 B2   4/2005   Barker et al.
(Continued)

FOREIGN PATENT DOCUMENTS

CN   101728530 A   6/2010
EP       1309021 A   5/2003
(Continued)

OTHER PUBLICATIONS

Nan et al., Solvothermal synthesis of lithium iron phosphate nanoplates, Jan. 2011, J. Mater. Chem, 21, 9994-9996 (Year: 2011).*
(Continued)

*Primary Examiner* — Daniel S Gatewood
(74) *Attorney, Agent, or Firm* — Nixon Peabody LLP; Jeffrey L. Costellia

(57) ABSTRACT

A lithium ion secondary battery includes a positive electrode, a negative electrode, and an electrolyte provided between the positive electrode and the negative electrode. The positive electrode includes a positive electrode current collector and a positive electrode active material layer over the positive electrode current collector. The positive electrode active material layer includes a plurality of lithium-containing, composite oxides each of which is expressed by $LiMPO_4$ (M is one or more of Fe (II), Mn (II), Co (II), and Ni (II)) that is a general formula. The lithium-containing composite oxide is a flat single crystal particle in which the length in the b-axis direction is shorter than each of the lengths in the a-axis direction and the c-axis direction. The lithium-containing composite oxide is provided over the positive electrode current collector so that the b-axis of the
(Continued)

single crystal particle intersects with the surface of the positive electrode current collector.

16 Claims, 7 Drawing Sheets

Related U.S. Application Data continuation of application No. 13/419,639, filed on Mar. 14, 2012, now Pat. No. 9,577,261.

(51) Int. Cl.
| | |
|---|---|
| *H01M 4/58* | (2010.01) |
| *H01M 4/13* | (2010.01) |
| *H01M 4/36* | (2006.01) |
| *H01M 4/66* | (2006.01) |
| *H01M 4/02* | (2006.01) |
| *C30B 1/00* | (2006.01) |

(52) U.S. Cl.
CPC ......... *H01M 4/362* (2013.01); *H01M 4/5825* (2013.01); *H01M 4/665* (2013.01); *H01M 4/668* (2013.01); *C30B 1/00* (2013.01); *H01M 2004/021* (2013.01); *H01M 2004/028* (2013.01); *Y02E 60/122* (2013.01); *Y02P 70/54* (2015.11)

(56) References Cited

U.S. PATENT DOCUMENTS

| | | | |
|---|---|---|---|
| 7,001,690 | B2 | 2/2006 | Barker et al. |
| 7,026,072 | B2 | 4/2006 | Barker et al. |
| 7,135,252 | B2 | 11/2006 | Thackeray et al. |
| 7,438,992 | B2 | 10/2008 | Barker et al. |
| 7,718,314 | B2 | 5/2010 | Komiyama et al. |
| 8,231,998 | B2 | 7/2012 | Sastry et al. |
| 8,603,662 | B2 | 12/2013 | Sastry et al. |
| 8,795,898 | B2 | 8/2014 | Sugiura et al. |
| 8,916,293 | B2 | 12/2014 | Sugiura et al. |
| 2004/0096743 | A1* | 5/2004 | Okae |
| 2007/0031732 | A1 | 2/2007 | Chiang et al. |
| 2008/0248382 | A1 | 10/2008 | Sastry et al. |
| 2008/0268339 | A1 | 10/2008 | Suzuki |
| 2009/0197174 | A1 | 8/2009 | Levassbur et al. |
| 2009/0233096 | A1 | 9/2009 | Schall et al. |
| 2010/0112443 | A1 | 5/2010 | Blomgren et al. |
| 2010/0159325 | A1 | 6/2010 | Sugiura et al. |
| 2010/0159326 | A1 | 6/2010 | Sugiura et al. |
| 2010/0159329 | A1 | 6/2010 | Sugiura et al. |
| 2010/0159333 | A1 | 6/2010 | Sugiura et al. |
| 2010/0163790 | A1 | 7/2010 | Ceder et al. |
| 2010/0173204 | A1 | 7/2010 | Sugiura et al. |
| 2011/0195310 | A1 | 8/2011 | Kawamoto et al. |
| 2011/0274976 | A1 | 11/2011 | Blomgren et al. |
| 2012/0164534 | A1 | 6/2012 | Choi et al. |
| 2012/0177842 | A1 | 7/2012 | Mikami et al. |
| 2012/0183839 | A1 | 7/2012 | Yuasa et al. |
| 2012/0214068 | A1 | 8/2012 | Dai et al. |
| 2012/0237426 | A1 | 9/2012 | Futamura |
| 2013/0045424 | A1 | 2/2013 | Sugiura et al. |
| 2017/0155137 | A1 | 6/2017 | Okae et al. |

FOREIGN PATENT DOCUMENTS

| | | | |
|---|---|---|---|
| EP | 2369660 | A | 9/2011 |
| EP | 2369661 | A | 9/2011 |
| EP | 2369662 | A | 9/2011 |
| EP | 2369663 | A | 9/2011 |
| EP | 2369664 | A | 9/2011 |
| EP | 2369665 | A | 9/2011 |
| EP | 2369666 | A | 9/2011 |
| JP | 07022030 | A * | 1/1995 |
| JP | 07-037586 | A | 2/1995 |
| JP | 09-255340 | A | 9/1997 |
| JP | 11-025983 | A | 1/1999 |
| JP | 2002-270172 | A | 9/2002 |
| JP | 2003-520182 | | 7/2003 |
| JP | 2003-223893 | A | 8/2003 |
| JP | 2004-079276 | A | 3/2004 |
| JP | 2006-252945 | A | 9/2006 |
| JP | 2007-103339 | A | 4/2007 |
| JP | 2008-159495 | A | 7/2008 |
| JP | 2008-198553 | A | 8/2008 |
| JP | 2010-040218 | A | 2/2010 |
| JP | 2010-524158 | | 7/2010 |
| JP | 2010-219069 | A | 9/2010 |
| JP | 2011-076820 | A | 4/2011 |
| JP | 4767798 | | 9/2011 |
| KR | 2002-0070486 | A | 9/2002 |
| KR | 2004-0018963 | A | 3/2004 |
| KR | 1020020070486 | * | 7/2005 |
| WO | WO-2001/054212 | | 7/2001 |
| WO | WO-2006/027925 | | 3/2006 |
| WO | WO-2008/077447 | | 7/2008 |
| WO | WO-2008/121972 | | 10/2008 |
| WO | WO-2010/051565 | | 5/2010 |
| WO | WO-2010/074302 | | 7/2010 |

OTHER PUBLICATIONS

Kang.B et al., "Battery Materials for Ultrafast Charging and Discharging", Nature, Mar. 12, 2009. vol. 458, No. 7235, pp. 190-193.

Zhou.F et al., "The Li intercalation potential of LiMPO4 and LiMSiO4 olivines with M=Fe, Mn, Co, Ni", Electrochemistry Communications, Nov. 1, 2004, vol. 6, No. 11, pp. 1144-1148.

Liang.G et al., "Anisotropy in magnetic properties and electronic structure of single-crystal LiFePO4", Phys Rev. B (Physical Review. B), 2008, vol. 77, pp. 064414-1-064414-12.

Dokko.K et al., "Electrochemical properties of LiFePO4 prepared via hydrothermal route", Journal of Power Sources, Mar. 20, 2007, vol. 165, No. 2, pp. 656-659.

Tannai.H et al., "Optimization of Hydrothermal Synthesis Process and Evaluation of LiFePO4 Cathode for Rechargabie Lithium Batteries", The 48th Battery Symposium in Japan, Nov. 13, 2007, pp. 66-67.

Chinese Office Action (Application No. 201210082550.3) dated Jun. 3, 2015.

Saravanan.K et al., "Storage performance of LiFePO4 nanoplates", Journal of Materials Chemistry, Feb. 7, 2009, vol. 19. No. 5. pp. 605-610.

Nan.C et al., "Solvothermal synthesis of lithium iron phosphate nanoplates", Journal of Materials Chemistry, Jan. 6, 2011, vol. 21, pp. 9994-9996.

Korean Office Action (Application No. 2012-0026577) dated Jun. 12, 2018.

Olivine-type LiFePO4 positive electrode, Solar Cell Handbook, Feb. 10, 2010, pp. 480-484, Ohmsha.

* cited by examiner

LITHIUM ION SECONDARY BATTERY AND METHOD FOR MANUFACTURING THE SAME

BACKGROUND OF THE INVENTION

1. Field of the Invention

The present invention relates to a lithium ion secondary battery and a method for manufacturing the lithium ion secondary battery.

2. Description of the Related Art

In recent years, lithium ion secondary batteries have been under development. Because of their high thermal stability, lithium-containing composite oxides having olivine structures, such as $LiFePO_4$, $LiMnPO_4$, $LiCoPO_4$, and $LiNiPO_4$, have been expected as positive electrode active materials of lithium ion secondary batteries. Such a lithium-containing composite oxide having an olivine structure contains a bivalent transition metal element (e.g., Fe, Mn, Co, and Ni).

As a method for manufacturing lithium-containing composite oxides having olivine structures, a solid phase method, a hydrothermal method, a sol-gel method, or the like is used (e.g., Patent Document 1). In order to increase the discharge capacity and the energy density of a lithium ion secondary battery, attempts have been made to reduce the particle diameters and variation in particle size of an active material included in an active material layer that relates to insertion and extraction of ions functioning as carriers. A hydrothermal method has been used as a method for manufacturing lithium-containing composite oxides with less variation in particle size and small particle diameters.

REFERENCE

Patent Document

[Patent Document 1] PCT International Publication No. 08/077447 pamphlet

SUMMARY OF THE INVENTION

However, lithium-containing composite oxides included in a lithium ion secondary battery have high resistance, so that there has been a limit on the increase of the discharge capacity and the energy density.

In view of the above, an object of one embodiment of the present invention is to provide a lithium ion secondary battery having higher discharge capacity and higher energy density and a method for manufacturing such a lithium ion secondary battery.

One embodiment of the present invention is a lithium ion secondary battery including a positive electrode, a negative electrode, and an electrolyte provided between the positive electrode and the negative electrode. The positive electrode includes a positive electrode current collector and a positive electrode active material layer provided over the positive electrode current collector. The positive electrode active material layer includes a plurality of lithium-containing composite oxides. The lithium-containing composite oxide is expressed by $LiMPO_4$ (M is one or more of Fe (II), Mn (II), Co (II), and Ni (II)) that is a general. formula. The lithium-containing composite oxide is a fiat single crystal particle. In the flat single crystal particle, the length in the b-axis direction is shorter than each of the lengths in the a-axis direction and the c-axis direction, The length in the b-axis direction is typically greater than or equal to 5 nm and less than or equal to 50 nm. The b-axis of the single crystal particle of the lithium-containing composite oxide forms a given angle with a surface of the positive electrode current collector, and the b-plane of the single crystal particle is in contact with the positive electrode current collector. In other words, the lithium-containing composite oxide is provided over the positive electrode current collector so that the b-axis of the single crystal particle intersects with the surface of the positive electrode current collector. Typically, the b-axis of the single crystal particle intersects with the surface of the positive electrode current collector at an angle greater than or equal to 60 degrees and less than or equal to 90 degrees.

Note that the lithium-containing composite oxide has an olivine structure. The lithium-containing composite oxide has an orthorhombic crystal structure and belongs to a space group Pnma (62). In the single crystal particle of the lithium-containing composite oxide, the lengths in the a-axis direction and the c-axis direction are each longer than the length in the b-axis direction. In the positive electrode active material layer, the lithium-containing composite oxides may be stacked on each other.

Further, one embodiment of the present invention is a method for manufacturing a lithium ion secondary battery, which includes the steps of applying slurry including a lithium -containing composite oxide that is a fiat single crystal particle whose length in the b-axis direction is greater than or equal to 5 nm and less than or equal to 50 nm to a positive electrode current collector; and exerting pressure on or transmitting vibration to the slurry including the lithium-containing composite oxide so that the lithium-containing composite oxide is provided over the positive electrode current collector while the b-axis of the lithium-containing composite oxide forms a given angle with a surface of the positive electrode current collector and the b-plane is in contact with the positive electrode current collector. In other words, the lithium-containing composite oxide is provided over the positive electrode current collector so that the b-axis of the single crystal particle intersects with the surface of the positive electrode current collector.

In the positive electrode of the lithium ion secondary battery that is one embodiment of the present invention, the positive electrode active material layer includes an olivine lithium-containing composite oxide that is a flat single crystal particle in which the length in the b-axis direction is shorter than each of the lengths in the a-axis direction and the c-axis direction. Further, a plane including the a-axis and the c-axis (b-plane) is in contact with the positive electrode current collector and the b-axis forms a given angle with the positive electrode current collector at a given angle. In other words, the b-axis intersects with a surface of the positive electrode current collector. Therefore, migration of lithium ions between the current collector and an electrolyte is easy. With the use of the positive electrode active material layer having this structure for a positive electrode, a lithium ion secondary battery with reduced internal resistance and higher power can be provided.

According to one embodiment of the present invention, the discharge capacity of a lithium ion secondary battery can be increased, and the lithium ion secondary battery can have higher power. Further, a lithium ion secondary battery with higher discharge capacity and higher power can be manufactured.

BRIEF DESCRIPTION W THE DRAWINGS

DETAILED DESCRIPTION OF THE INVENTION

Figure 1A:
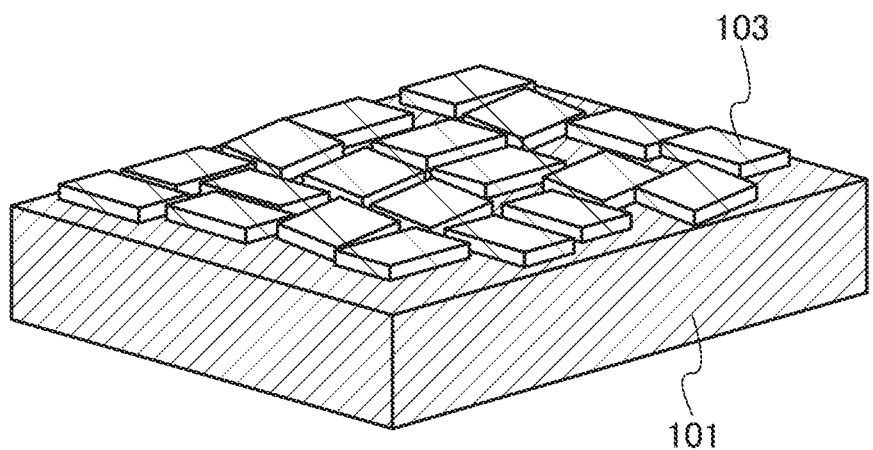
FIGS. 1A to 1C are perspective views showing positive electrodes of a lithium ion secondary batteries.

Examples of embodiments of the present invention will be described with reference to the drawings below. Note that the present invention is not limited to the following description, and it will be easily understood by those skilled in the art that various changes and modifications can be made without departing from the spirit and scope of the present invention. Therefore, the present invention should not be interpreted as being limited to the following description of the embodiments. In description with reference to the drawings, in some cases, the same reference numerals are used in common for the same portions in different drawings. Further, in some cases, the same hatching patterns are used in similar parts, and the similar parts are not necessarily designated by reference numerals.

(Embodiment 1)

In this embodiment, a positive electrode of a lithium ion secondary battery that is one embodiment of the present invention and a method for forming the positive electrode of the lithium-ion secondary battery will be described with reference to FIGS. 1A to 1C, FIG. 2, and FIGS. 3A to 3C.

Figure 1B:
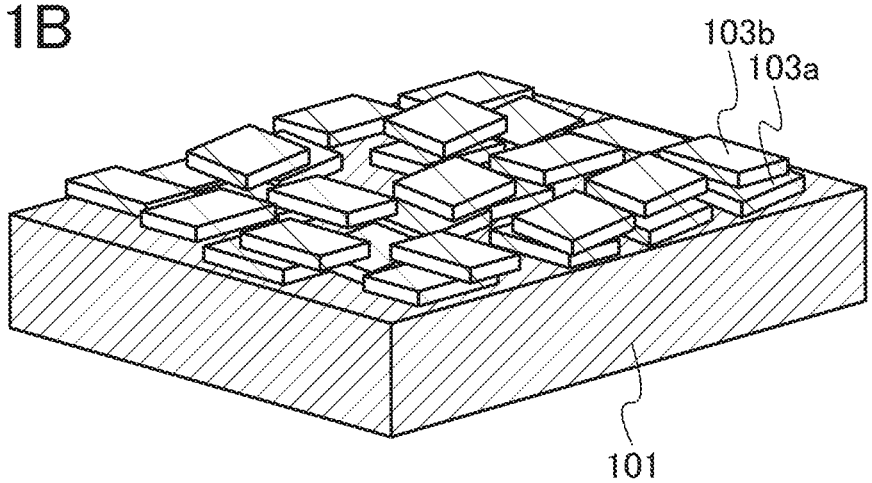
Figure 1C:
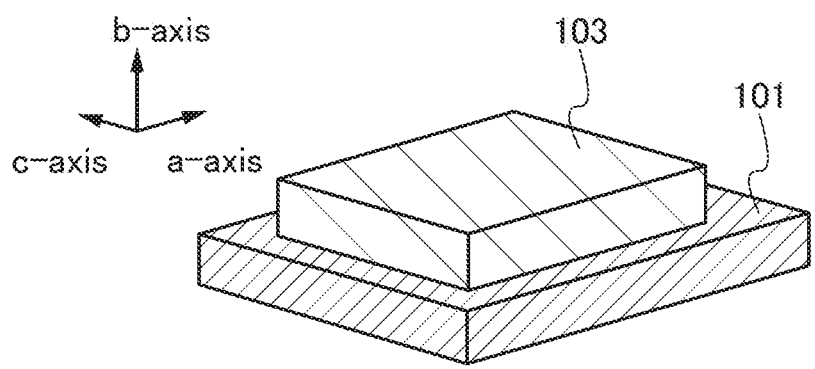

FIGS. 1A to 1C are perspective views of positive electrodes of lithium ion secondary batteries.

As shown in FIG. 1A, lithium-containing composite oxides 103 which are positive electrode active materials are provided over a positive electrode current collector 101.

In FIG. 1B, lithium containing composite oxides 103$a$ and 103$b$, which are positive electrode active materials, are stacked over the positive electrode current collector 101.

Note that a region over the positive electrode current collector 101, which includes a plurality of positive electrode active materials, is called a positive electrode active material layer. Although not shown, the positive electrode active material layer may include a conduction auxiliary agent, a binder, and the like. The positive electrode active material refers to a substance that relates to insertion and extraction of ions functioning as carriers. Thus, the lithium-containing composite oxides are positive electrode active materials but a carbon layer, a conduction auxiliary agent, a binder, and a solvent are not active materials.

A material having high conductivity such as platinum, aluminum, copper, titanium, or stainless steel can be used for the positive electrode current collector 101. The positive electrode current collector 101 can have a shape such as a foil shape, a plate shape, or a net shape as appropriate.

As the thickness of the positive electrode active material layer, a desired thickness is selected from the range of 20 µm to 100 µm. It is preferable to adjust the thickness of the positive electrode active material layer as appropriate so that cracks and separation do not occur.

The lithium-containing composite oxide included in the positive electrode active material layer is a single crystal particle having an olivine structure. Typical examples of the olivine lithium-containing composite oxide (general formula thereof is LiMPO$_4$ (M is one or more of Fe (II), Mn (II), Co (II), and Ni (II))) include LiFePO$_4$, LiNiPO$_4$, LiCoPO$_4$, LiMnPO$_4$, LiFe$_a$Ni$_b$PO$_4$, LiFe$_a$Co$_b$PO$_4$, LiFe$_a$Mn$_b$PO$_4$, LiNi$_a$Co$_b$PO$_4$, LiNi$_a$Mn$_b$PO$_4$, LiMn$_a$Co$_b$PO$_4$ (a+b≤1, 0<a<1, and 0<b<1), LiFe$_c$Ni$_d$Co$_e$PO$_4$, LiFe$_c$Ni$_d$Mn$_e$PO$_4$, LiNiCo$_d$Mn$_e$PO$_4$ (c+d+e≤1, 0<c<1, 0<d<1, and 0<e<1), LiFc$_f$Ni$_g$Co$_h$Mn$_i$PO$_4$ (f+g+h+i≤1, 0<f<1, 0<g<1, 0<h<1, and 0<i<1), and the like.

Note that a surface of the lithium-containing composite oxide may be covered with a carbon layer with a thickness less than or equal to 10 nm, preferably greater than or equal to 1 nm and less than or equal to 10 nm.

Here, the shape of the lithium-containing composite oxide that is a positive electrode active material will be described with reference to FIG. 1C.

The lithium-containing composite oxide 103 has an orthorhombic crystal structure and belongs to a space group Pnma (62). The lithium-containing composite oxide 103 is a flat single crystal particle in which the length in the b-axis direction is shorter than each of the lengths in the a-axis direction and the c-axis direction. Since lithium ions are diffused in the b-axis direction in an olivine structure, it is preferable to set the length in the b-axis direction to longer than or equal to 5 nm and shorter than or equal to 50 nm, preferably longer than or equal to 5 nm and shorter than or equal to 20 nm so that lithium ions are easily diffused. Further, it is preferable to set the ratio of the lengths in the a-axis direction and the c-axis direction to greater than or equal to 0.5 and less than or equal to 1.5, preferably greater than or equal to 0.8 and less than or equal to 1.2, i.e., the b-plane having a square shape or substantially square shape is preferable, because the lithium-containing composite oxides 103 can be arranged densely over the positive electrode current collector 101.

In addition, in the lithium-containing composite oxide, a plane including the a-axis and the c-axis, i.e., the b-plane is in contact with the positive electrode current collector 101, and the b-axis forms a given angle with a surface of the positive electrode current collector 101 at a given angle. In other words, the b-axis of the single crystal particle intersects with the surface of the positive electrode current collector 101. The b-axis of the lithium-containing composite oxide intersects with the surface of the positive electrode current collector 101 at an angle typically greater than or equal to 60 degrees and less than or equal to 90 degrees. Since lithium ions arc diffused in the b-axis direction in an olivine structure it is preferable that the b-axis intersects with the surface of the positive electrode current collector 101 at an angle greater than or equal to 60 degrees and less than or equal to 90 degrees to diffuse a larger number of lithium ions. Note that the term "the b-axis intersects with the surface of the positive electrode current collector 101" means that the b-axis and the surface of the positive electrode current collector 101 have an intersection point. In contrast, the term "the b-axis does not intersect with the surface of the positive electrode current collector 101" means that the b-axis is in parallel to the surface of the positive electrode current collector 101.

Note that it can be judged that the lithium-containing composite oxide 103 is a flat single crystal particle in which the length in the b-axis direction is shorter than each of the lengths in the a-axis direction and the c-axis direction, by using more than one of a scanning electron microscope (SEM), a scanning transmission electron microscope (STEM), a transmission electron microscope (TEM), and X-ray diffraction (XRD). For example, X-ray diffraction (XRD) measurement can show that the b-axis of the single crystal particle of the lithium-containing composite oxide 103 intersects with the surface of the positive electrode current collector 101. Further, the lithium-containing composite oxide 103 is judged as a single crystal particle because the contrast of a dark-field image observed with a transmission electron microscope (TEM) is uniform and thus grain boundaries are not seen in the dark-field image.

Figure 2:
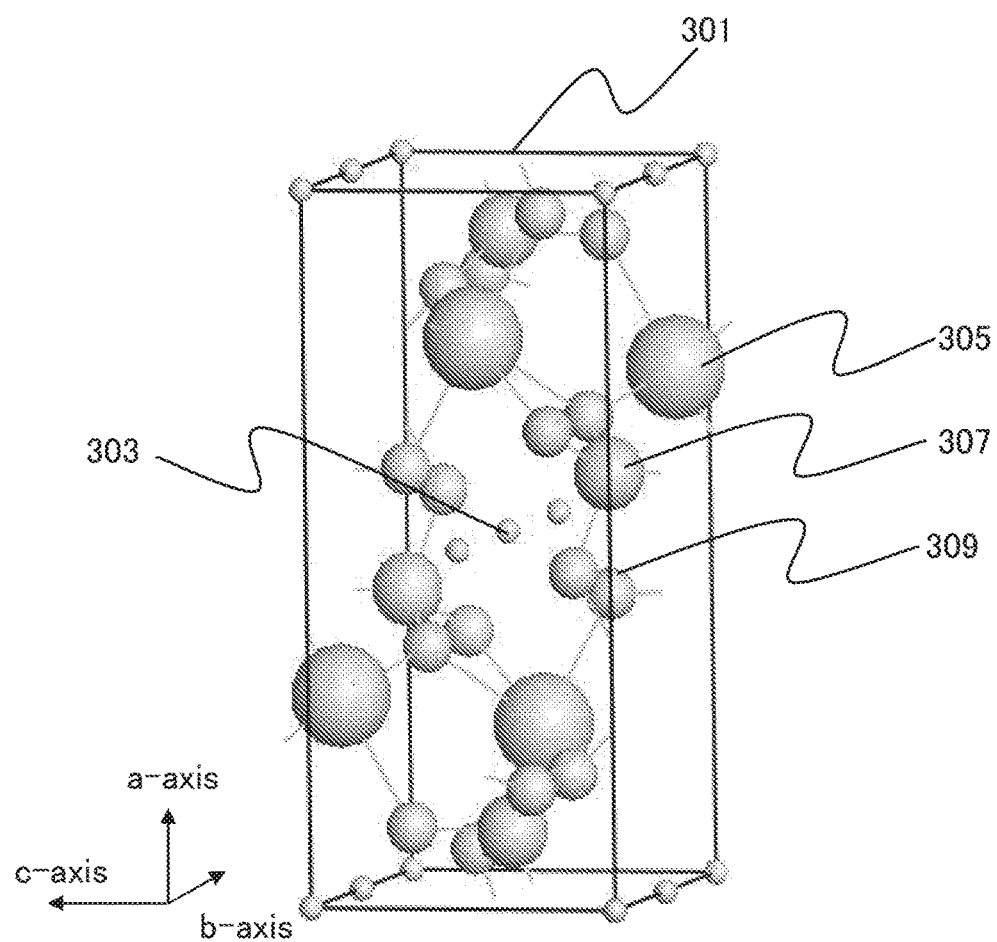
FIG. 2 shows a crystal structure of olivine LiFePO$_4$.

Here, description is given of an olivine structure. FIG. 2 shows a unit cell 301 of lithium iron phosphate (LiFePO$_4$) that is an example of an olivine lithium-containing composite oxide. An olivine lithium iron phosphate has an orthorhombic crystal structure, and includes four formula units of lithium iron phosphate (LiFePO$_4$) within a unit cell. The basic framework of the olivine structure is a hexagonal close-packed structure of an oxide ion, in which lithium, iron, and phosphorus are located in the close-packed gaps.

Further, the olivine lithium iron phosphate (LiFePO$_4$) has a tetrahedral site and two kinds of octahedral sites. The tetrahedral site has four oxygen atoms in the vertices. The octahedral sites have six oxygen atoms in the vertices. Phosphorus 307 is located at the center of the tetrahedral site, and lithium 303 or iron 305 is located at the center of the octahedral sites. The octahedral site with the lithium 303 located at the center is called a M1 site, and the octahedral site with the iron 305 located at the center is called a M2 site. The M1 site is arranged one-dimensionally in the b-axis direction. In other words, the lithium 303 is arranged one-dimensionally in a <010> direction. Note that for convenience, bonds between the lithium 303 and other ions or atoms are not shown by lines.

The irons 305 of neighboring M2 sites are bonded in a zigzag manner with oxygen 309 provided therebetween. Also, the oxygen 309 bonded between the irons 305 of the neighboring M2 sites, is also bonded to the phosphorus 307 of the tetrahedral site. Thus, the bond between the iron atom and the oxygen atom and the bond between the oxygen atom and the phosphorus atom are continuous.

Note that the olivine lithium iron phosphate may be distorted. Furthermore, regarding the lithium iron phosphate, the composition ratio of the lithium, the iron, the phosphorus, and the oxygen is riot limited to 1:1:1:4. Also, as the transition metal (M) of a lithium transition metal phosphate (LiMPO$_4$), a transition metal which has a larger ionic radius than a lithium ion, such as manganese, cobalt, or nickel, may be used.

Even iron phosphate alone from the olivine lithium iron phosphate shown in FIG. 2 has a stable structure. For this reason, insertion and extraction of all lithium ions are possible. Further, the olivine lithium iron phosphate has heat stability. In the b-axis direction in the olivine lithium iron phosphate, lithium ions are arranged one-dimensionally and are diffused in the b-axis direction. Thus, diffusion of lithium ions can be easy in a single crystal particle with a short length in the b-axis direction.

In the positive electrode of this embodiment, the positive electrode active material layer includes an olivine lithium-containing composite oxide which is a flat single crystal particle in which the length in the b-axis direction is shorter than each of the lengths in the a-axis direction and the c-axis direction. Further, the plane including the a-axis and the c-axis, i.e., the b-plane is in contact with the positive electrode current collector, and the b-axis whose direction is the direction of diffusion of lithium ions in the olivine structure intersects with a surface of the positive electrode current collector. Therefore, the number of diffusion of lithium ions between the current collector and an electrolyte can be increased. Furthermore, with the use of the lithium-containing composite oxide of this embodiment for a positive electrode active material in a lithium ion secondary battery, the internal resistance of the lithium ion secondary battery is reduced, so that the lithium ion secondary battery can have higher power and discharge capacity thereof can be as high as theoretical discharge capacity. Note that in this specification, an electrolyte means the one that includes a material in which lithium ions stably exist and with which lithium ions functioning as carrier ions can be transferred. The electrolyte includes in its category an electrolyte solution obtained by dissolving in a solvent, a material (solute) in which lithium ions stably exist, and a solid electrolyte including a material (solute) in which lithium ions stably exist, for example.

Further, the plurality of lithium-containing composite oxides is stacked in the positive electrode active material layer as shown in FIG. 1B, whereby the lithium ion secondary battery can have discharge capacity higher than that in the case of FIG. 1A.

Next, a method for forming the positive electrode of the lithium ion secondary battery shown in FIGS. 1A to 1C will be described with reference to FIGS. 3A to 3C.

Slurry 105 including the lithium-containing composite oxides 103 is applied to the positive electrode current collector 101. Then, it is preferable to make the thickness of the slurry 105 including the lithium-containing composite oxides 103 approximately uniform with the use of a squeegee, a blade, or the like. Further, a solvent of the slurry 105 may be dried so that the viscosity of the slurry 105 is increased. Note that through the steps, as shown in FIG. 3A, the lithium-containing composite oxides 103 are applied randomly to the positive electrode current collector 101; thus, the a-axis direction, the b-axis direction, or the c-axis direction of each lithium-containing composite oxides intersects with the surface of the positive electrode current collector 101. The lithium-containing composite oxide is a flat single crystal particle in which the length in the b-axis direction is shorter than each of the lengths in the a-axis direction and the c-axis direction. Therefore, when the lithium-containing composite oxides 103 are dispersed over the positive electrode current collector 101 so that the a-axis directions or the c-axis directions thereof intersect with the surface of the positive electrode current collector 101, i.e., so that the a-planes or the c-planes thereof are in contact with the positive electrode current collector 101, the lithium-containing composite oxides lie so that the height thereof is high as shown by a lithium-containing composite oxide 103c.

The slurry 105 including the lithium-containing composite oxides includes a binder and a conduction auxiliary agent. Note that in FIGS. 3A and 3B, the slurry 105 including the lithium-containing composite oxides is shown by dashed lines.

A solid method, a hydrothermal method, a spray pyrolysis method, or the like can be used as appropriate for the method for manufacturing the lithium-containing composite oxide. Note that a hydrothermal method is preferably used for a method for manufacturing flat single crystal particles which have small particle diameters and less variation in particle size and in each of which the length in the b-axis direction is shorter than each of the lengths in the a-axis direction and the c-axis direction.

As the binder, a polysaccharide such as starch, carboxymethyl cellulose, hydroxypropyl cellulose, regenerated cellulose, or diacetyl cellulose; a vinyl polymer such as polyvinylchloride, polyvinyl pyrrolidone, polytetrafluoroethylene, polyvinyliden fluoride, polyethylene, polypropylene, polyvinyl alcohol, ethylene-propylene-diene monomer (EPDM) rubber, sulfonated EPDM rubber, styrene-butadiene rubber, butadiene rubber, or fluorine rubber; polyether such as polyethylene oxide; or the like is given.

As the conduction auxiliary agent, a material which is itself an electron conductor and does not cause chemical reaction with other materials in a lithium ion secondary battery may be used. For example, carbon-based materials such as graphite, carbon fiber, carbon black, acetylene black, and VGCF (registered trademark); metal materials such as copper, nickel, aluminum, and silver; and powder, fiber, and the like of mixtures thereof arc given. The conduction auxiliary agent is a material that assists conductivity between active materials. The conduction auxiliary agent is filled between active materials which are apart and makes conduction between the active materials.

Note that a solvent may be used as appropriate to disperse or dissolve the lithium-containing composite oxides, the binder, and the conduction auxiliary agent in the slurry.

Lithium-containing composite oxides with small particle diameters are likely to agglomerate and difficult to disperse uniformly in the slurry. For this reason, a dispersant and a disperse medium are preferably used as appropriate to disperse the lithium-containing composite oxides uniformly in the slurry.

As the dispersant, a polymer dispersant, a surfactant dispersant (low-molecular dispersant), an inorganic dispersant, and the like are given. As the disperse medium, alcohol, water, or the like is given. Note that the dispersant and the disperse medium may be selected as appropriate to suit the lithium-containing, composite oxide.

Next, physical pressure is exerted on the slurry 105 including the lithium-containing composite oxide 103. As a method for exerting physical pressure on the slurry 105 including the lithium-containing composite oxides 103, a method of moving a roller, a squeegee, a blade, or the like over the slurry 105 including the lithium-containing composite oxides 103 is given. Alternatively, ultrasonic vibration may be transmitted to the slurry including the lithium-containing composite oxides, instead of exerting physical pressure on the slurry. Consequently, in the slurry 105 including the lithium-containing composite oxides 103, the lithium-containing composite oxide 103c whose a-axis or c-axis intersects with the surface of the positive electrode current collector 101, i.e., the lithium-containing composite oxide 103c whose a-plane or c-plane is in contact with the positive electrode current collector 101, falls down; thus, the lithium-containing composite oxide 103 can be in the state where the b-axis thereof intersects with the surface of the positive electrode current collector 101 as shown in FIG. 3B. In addition, the b-plane of the lithium-containing composite oxide 103 can be in contact with the positive electrode current collector 101. In other words, an area of the positive electrode current collector 101, which is in contact with the lithium-containing composite oxides 103, can be increased.

Figure 3A:
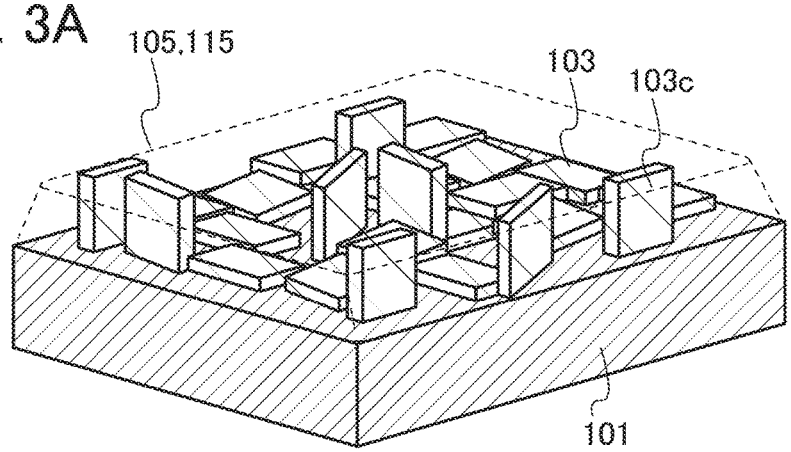
FIGS. 3A to 3C are perspective views showing a method for forming a positive electrode of a lithium ion secondary battery.
Figure 3B:
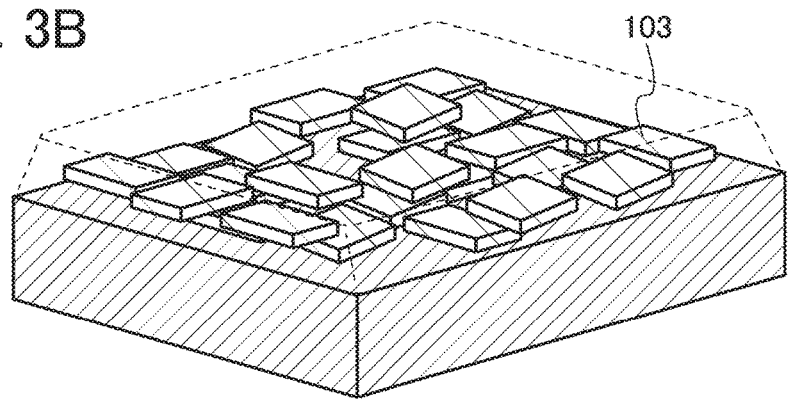
Figure 3C:
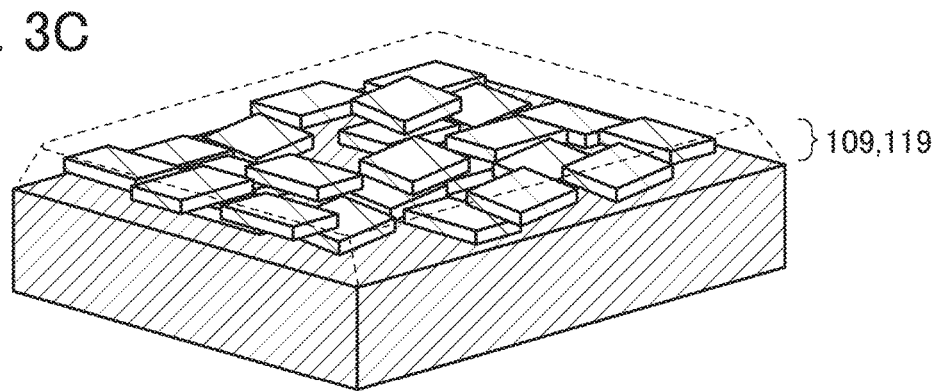

Then, the slurry 105 including the lithium-containing composite oxides 103 is heated to remove the solvent, and the lithium-containing composite oxides 103 are fixed to the positive electrode current collector with a binder; thus, a positive electrode active material layer 109 is formed (see FIG. 3C). Note that the binder becomes porous and fibrous through the heating and includes gaps, so that the lithium-containing composite oxides are exposed in the gaps. Note that in FIG. 3C, the positive electrode active material layer 109 is shown by dashed lines.

Through the above steps, the positive electrode of the lithium ion secondary battery can be formed.

In the positive electrode of this embodiment, the positive electrode active material layer includes the olivine lithium-containing composite oxide which is a flat single crystal particle in which the length in the b-axis direction is shorter than each of the lengths in the a-axis direction and the c-axis direction. Further, the plane including the a-axis and the c-axis, i.e., the b-plane is in contact with the positive electrode current collector, and the b-axis whose direction is the direction of diffusion of lithium ions intersects with the surface of the positive electrode current collector. Therefore, the number of diffusion of lithium ions between the current collector and the electrolyte can be increased. Further, with the use of the positive electrode described in this embodiment for a lithium ion secondary battery, the lithium ion secondary battery can have reduced internal resistance and higher power. Moreover, the lithium ion secondary battery can have discharge capacity as high as theoretical discharge capacity.

(Embodiment 2)

In this embodiment, a method for forming a positive electrode active material layer including a solid electrolyte over a positive electrode current collector will be described. Note that here, description will be made with reference to Embodiment 1.

In this embodiment, a binder and a solute of an electrolyte of a lithium ion secondary battery are included in the positive electrode active material layer described in Embodiment 1.

As the solute of the electrolyte, a material in which lithium ions functioning as carrier ions can transfer and exist stably is used. Typical examples of the solute of the electrolyte include lithium salts such as $LiClO_4$, $LiAsF_6$, $LiBF_4$, $LiPF_6$, and $LiC_2F_5SO_2)_2N$.

Note that a solvent may be used as appropriate to disperse or dissolve the solute of the electrolyte in slurry.

As shown in FIG. 3A, in a manner similar to that in Embodiment 1, slurry 115 including the solute of the electrolyte as well as the lithium-containing composite oxides 103, the binder, and a conductive auxiliary agent is applied to the positive electrode current collector 101. Then, the thickness of the slurry 115 may be made uniform and a solvent or the slurry 115 may be dried. Note that in FIGS. 3A and 3B, the slurry 115 including the lithium-containing composite oxides is shown by dashed lines.

Next, in a manner similar to that in Embodiment 1, physical pressure is exerted on the slurry 115 including the lithium-containing composite oxides 103. Alternatively, ultrasonic vibration may be transmitted to the slurry 115 including the lithium-containing composite oxides 103. Consequently, as shown in FIG. 3B, the lithium-containing composite oxide 103 can be in the state where the b-axis thereof intersects with the surface of the positive electrode current collector 101. In addition, the b-plane of the lithium-containing composite oxide 103 can be in contact with the positive electrode current collector 101.

Then, in a mariner similar to that in Embodiment 1, the slurry 115 including the lithium-containing composite oxides 103 and a material of the binder are heated to remove the solvent, and the lithium-containing composite oxides 103 are fixed to the positive electrode current collector with the binder. Thus, a positive electrode active material layer filled with a solid electrolyte is formed (see FIG. 3C). Note that in FIG. 3C, a positive electrode active material layer 119 is shown by the dashed lines.

According to this embodiment, a positive electrode in which a positive electrode active material layer filled with a solid electrolyte is provided over a positive electrode current collector can be formed; thus, resistance at the interface between the electrode and the electrolyte can be reduced. As a result, with the use of the positive electrode described in this embodiment, the internal resistance of a lithium ion secondary battery is further reduced, the lithium ion secondary battery can have higher power, charge and discharge thereof can be performed at high speed, and the discharge capacity can be as high as theoretical discharge capacity.

(Embodiment 3)

In this embodiment, a lithium ion secondary battery and a method for manufacturing the lithium ion secondary battery will be described.

The lithium ion secondary battery in this embodiment will be described with reference to FIG. 4. Here, description is made below on a cross-sectional structure of the lithium ion secondary battery.

Figure 4:
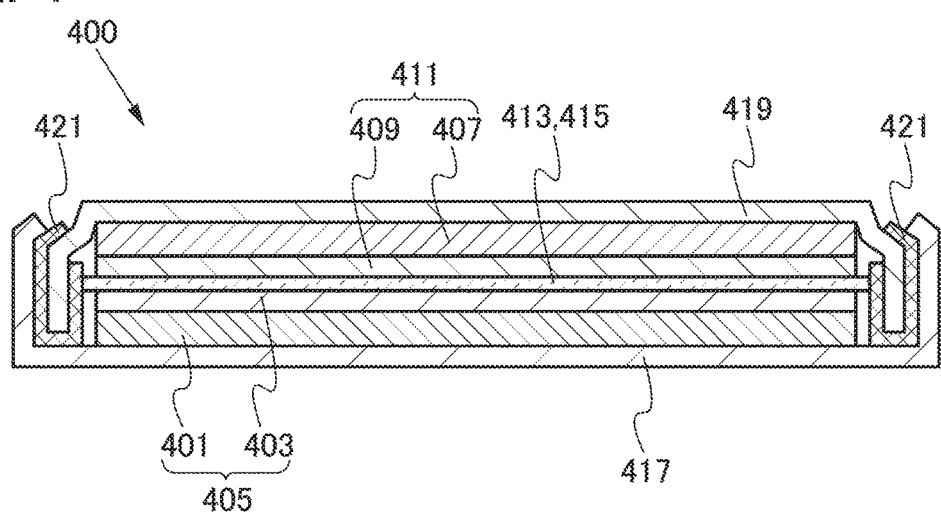
FIG. 4 is a cross-sectional view showing a lithium ion secondary battery.

FIG. 4 is a cross-sectional view of the lithium ion secondary battery.

A lithium ion secondary battery 400 includes a negative electrode 411 including a negative electrode current collector 407 and a negative electrode active material layer 409, a positive electrode 405 including a positive electrode current collector 401 and a positive electrode active material layer 403, and a separator 413 provided between the negative electrode 411 and the positive electrode 405. Note that the separator 413 includes an electrolyte 415. The negative electrode current collector 407 is connected to an external terminal 419 and the positive electrode current collector 401 is connected to an external terminal 417. An end portion of the external terminal 419 is embedded in a gasket 421. In other words, the external terminals 417 and 419 are insulated from each other with the gasket 421.

As the negative electrode current collector 407, a material having high conductivity such as copper, stainless steel, iron, or nickel can be used. The negative electrode current collector 407 can have a shape such as a foil shape, a plate shape, or a net shape as appropriate.

The negative electrode active material layer 409 is formed using a material capable of lithium-ion occlusion and emission. As the negative electrode active material layer 409, lithium, aluminum, graphite, silicon, tin, germanium, or the like is typically used. Note that the negative electrode current collector 407 may be omitted and the negative electrode active material layer 409 alone may be used as the negative electrode. The theoretical lithium occlusion capacity is larger in germanium, silicon, lithium, and aluminum than graphite. When the occlusion capacity is large, charge and discharge can be performed sufficiently even in a small area and a function as a negative electrode can be obtained; therefore, cost can be reduced and a lithium-ion secondary battery can be miniaturized. However, in the case of silicon or the like, the volume is approximately quadrupled due to lithium occlusion; therefore, the probability that the material itself gets vulnerable should be considered.

Note that the negative electrode active material layer 409 run be predoped with lithium. As a predoping method of lithium, a lithium layer may be formed on a surface of the negative electrode active material layer 409 by a sputtering method. Alternatively, a lithium foil is provided on the surface of the negative electrode active material layer 409, whereby the negative electrode active material layer 409 can be predoped with lithium.

A desired thickness of the negative electrode active material layer 409 is selected from the range of 20 µm to 100 µm.

Note that the negative electrode active material layer 409 may include a binder and a conduction auxiliary agent. As the binder and the conduction auxiliary agent, the binder and the conduction auxiliary agent which are included in the positive electrode active material layer described in Embodiment 1 can be used as appropriate.

As the positive electrode current collector 401 and the positive electrode active material layer 403, the positive electrode current collector 101 and the positive electrode active material layer 109 which are described in Embodiment 1 can be used as appropriate.

An insulating porous material is used for the separator 413. Typical examples of the separator 413 include cellulose (paper), polyethylene, and polypropylene, As a solute of the electrolyte 415, a material in which lithium ions functioning as carrier ions can transfer and stably exist and which is described in Embodiment 2 is used as appropriate.

As a solvent of the electrolyte 415, a material which can transfer lithium ions is used. As the solvent of the electrolyte 415, an aprotic organic solvent is preferably used. Typical examples of aprotic organic solvents include ethylene carbonate, propylene carbonate, dimethyl carbonate, diethyl carbonate, γ-butyrolactone, acetonitrile, dimethoxyethane, tetrahydrofuran, and the like, and one or more of these materials can be used. When a gelled polymer is used as the solvent of the electrolyte 415, safety against liquid leakage or the like is increased. Further, the lithium-ion secondary battery 400 can be made thinner and more lightweight. Typical examples of gelled polymers include a silicon gel, an acrylic gel, an acrylonitrile gel, polyethylene oxide, polypropylene oxide, a fluorine-based polymer, and the like.

As the electrolyte 415, a solid electrolyte such as $Li_3PO_4$ can be used. Note that in the case of using the solid electrolyte as the electrolyte 415, the separator 413 is unnecessary.

Alternatively, as described in Embodiment 2, a positive electrode active material layer filled with a solid electrolyte may be provided over the positive electrode current collector.

For the external terminals 417 and 419, a metal member such as a stainless steel plate or an aluminum plate can be used as appropriate.

Note that in this embodiment, a coin-type lithium ion secondary battery is given as the lithium ion secondary battery 400; however, a lithium ion secondary battery with various shapes, such as a sealing-type lithium ion secondary battery, a cylindrical lithium ion secondary battery, and a square-type lithium ion secondary battery, can be used. Further, a structure in which a plurality of positive electrodes, a plurality of negative electrodes, and a plurality of separators are stacked or roiled may be employed.

A lithium-ion secondary battery has a high energy density, a large capacity, and further a high output voltage. For these reasons, the size and the weight of the lithium ion battery can be reduced. Further, the lithium ion battery does not easily degrade due to repetitive charge and discharge and can be used for a long time, so that cost can be reduced. With the use of an olivine lithium-containing composite oxide which is a flat single crystal particle in which the length in the b-axis direction is shorter than each of the lengths in the a-axis direction and the c-axis direction for the positive electrode active material layer, the lithium ion secondary battery can have higher discharge capacity and higher power.

Next, a method for manufacturing the lithium ion secondary battery 400 described in this embodiment will be described.

First, a method for forming the negative electrode 411 will be described.

The negative electrode active material layer 409 is formed over the negative electrode current collector 407 by a coating method, a sputtering method, an evaporation method, or the like, so that the negative electrode 411 is formed. Alternatively, for the negative electrode 411, a foil, a plate, or a mesh of lithium, aluminum, graphite, or silicon can be used. Here, graphite predoped with lithium is used as the negative electrode.

Next, the method for manufacturing the positive electrode described in Embodiment 1 is used as appropriate to form the positive electrode 405.

Next, the negative electrode 411, the separator 413, and the positive electrode 405 are impregnated with the electrolyte 415. Then, the positive electrode 405, the separator 413, the gasket 421, the negative electrode 411, and the external terminal 419 are stacked in this order over the external terminal 417, and the external terminal 417 and the external terminal 419 are crimped to each other with a "coin cell crimper". Thus, the coin-type lithium ion secondary battery can be manufactured.

Note that a spacer and a washer may be provided between the external terminal 417 and the positive electrode 405 or between the external terminal 419 and the negative electrode 411 so that connection between the external terminal 417 and the positive electrode 405 or between the external terminal 419 and the negative electrode 411 is enhanced.

(Embodiment 4)

In this embodiment, an application of the lithium ion secondary battery described in Embodiment 3 will be described with reference to FIGS. 5A and 5B.

The lithium ion secondary battery described in Embodiment 3 can be used in electronic devices, e.g., cameras such as digital cameras or video cameras, digital photo frames, mobile phones (also referred to as cellular phones or cellular phone devices), portable game machines, portable information terminals, or audio reproducing devices. Further, the lithium ion secondary battery can be used in electric propulsion vehicles such as electric cars, hybrid cars, railway train vehicles, maintenance vehicles, carts, or electric wheelchairs. Here, an example of the electric propulsion vehicle will be described.

Figure 5A:
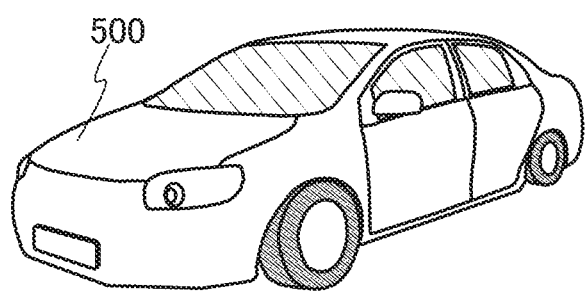
FIGS. 5A and 5B are perspective views showing an application of a lithium ion secondary battery.
Figure 5B:
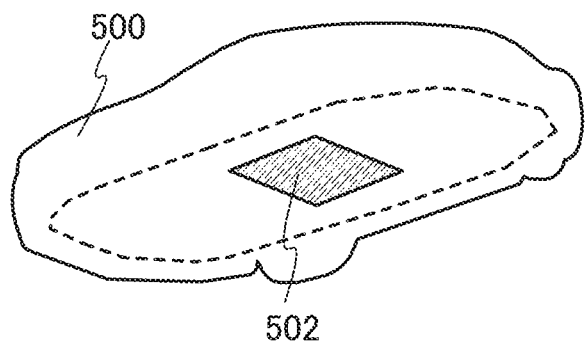

FIG. 5A shows a structure of a four-wheeled automobile 500 as an example of the electric propulsion vehicles. The automobile 500 is an electric vehicle or a hybrid vehicle. An example is shown in which the automobile 500 includes a lithium ion secondary battery 502 provided on its bottom portion. In order to clearly show the position of the lithium ion secondary battery 502 in the automobile 500, FIG. 5B shows the outline of the automobile 500 and the lithium ion secondary battery 502 provided on the bottom portion of the automobile 500. The lithium ion secondary battery described in Embodiment 3 can be used as the lithium ion secondary battery 502. The lithium ion secondary battery 502 can be charged by a plug-in technique or a wireless power feeding system, which supplies power from the outside.

(Embodiment 5)

In this embodiment, examples of using a lithium ion secondary battery according to one embodiment of the present invention in a wireless power feeding system (hereinafter referred to as RF power feeding system) will be described with reference to block diagrams in FIG. 6 and FIG. 7. In each of the block diagrams, blocks show elements independently, which are classified according to their functions, within a power receiving device and a power feeding device. However, it is practically difficult to completely separate the elements according to their functions; in some cases, one element can involve a plurality of functions.

First, the RF power feeding system will be described with reference to FIG. 6.

A power receiving device 600 is an electronic device or an electric propulsion vehicle which is driven by electric power supplied from a power feeding device 700, and can be applied to any other devices which are driven by electric power, as appropriate. Typical examples of the electronic device include cameras such as digital cameras or video cameras, digital photo frames, mobile phones, portable game machines, portable information terminals, audio reproducing devices, display devices, computers, and the like. Typical examples of the electric propulsion vehicle include electric cars, hybrid cars, railway train vehicles, maintenance vehicles, carts, electric wheelchairs, and the like, in addition, the power feeding device 700 has a function of supplying electric power to the power receiving device 600.

Figure 6:
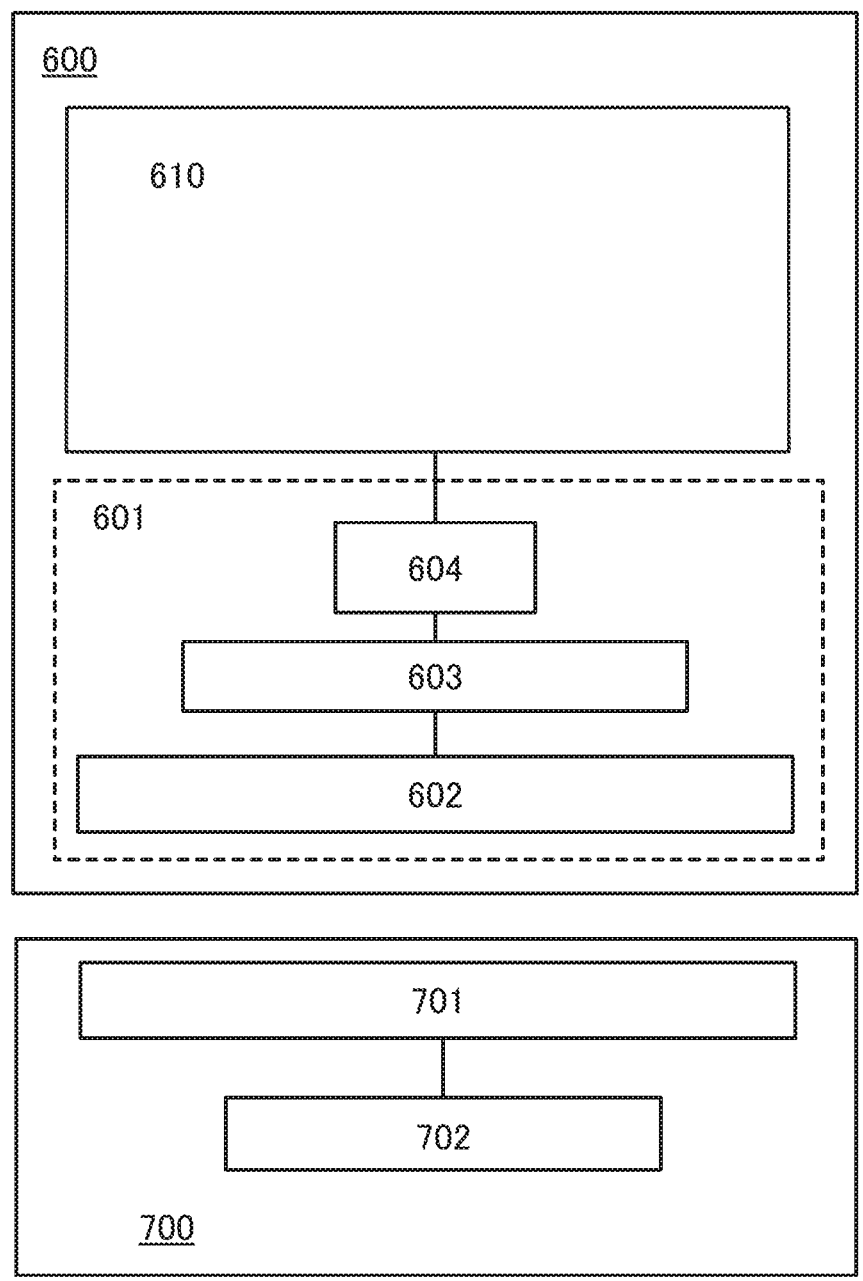
FIG. 6 shows an example of a structure of a wireless power feeding system.

In FIG. 6, the power receiving device 600 includes a power receiving device portion 601 and a power load portion 610. The power receiving device portion 601 includes at least a power receiving device antenna circuit 602, a signal processing circuit 603, and a lithium ion secondary battery 604. The power feeding device 700 includes at least a power feeding device antenna circuit 701 and a signal processing circuit 702.

The power receiving device antenna circuit 602 has a function of receiving a signal transmitted by the power feeding device antenna circuit 701 and transmitting a signal to the power feeding device antenna circuit 701. The signal processing circuit 603 processes a signal received by the power receiving device antenna circuit 602 and controls charging of the lithium ion secondary battery 604 and supplying of electric power from the lithium ion secondary battery 604 to the power load portion 610. In addition, the signal processing circuit 603 controls operation of the power receiving device antenna circuit 602. That is, the signal processing circuit 603 can control the intensity, the frequency, or the like of a signal transmitted by the power receiving device antenna circuit 602. The power load portion 610 is a driving, portion which receives electric power from the lithium ion secondary battery 604 and drives the power receiving device 600. Typical examples of the power load portion 610 include a motor, a driving circuit, and the like. Another device which drives the power receiving device by receiving electric power can be used as the power load portion 610 as appropriate. The power feeding device antenna circuit 701 has a function of transmitting a signal to the power receiving device antenna circuit 602 and receiving a signal from the power receiving device antenna circuit 602. The signal processing circuit 702 processes a signal received by the power feeding device antenna circuit 701. In addition, the signal processing circuit 702 controls operation of the power feeding device antenna circuit 701. That is, the signal processing circuit 702 can control the intensity, the frequency, or the like of a signal transmitted by the power feeding device antenna circuit 701.

The lithium ion secondary battery according to one embodiment of the present invention is used as the lithium ion secondary battery 604 included in the power receiving device 600 in the RE power feeding system shown in FIG. 6.

With the use of the lithium ion secondary battery according to one embodiment of the present invention for the RF power feeding system, the discharge capacity or the charge capacity (also referred to as the amount of power storage) can be high as compared with that of a conventional lithium ion secondary battery. Therefore, since the time interval of the wireless power feeding can be longer, power feeding can be less frequent.

In addition, with the use of the lithium ion secondary battery according to one embodiment of the present invention for the RE power feeding system, the power receiving device 600 can be compact and lightweight if the discharge capacity or the charge capacity with which the power load portion 610 can be driven is the same as that of a conventional secondary battery. Therefore, the total cost can be reduced.

Next, another example of the RE power feeding system will be described with reference to FIG. 7.

Figure 7:
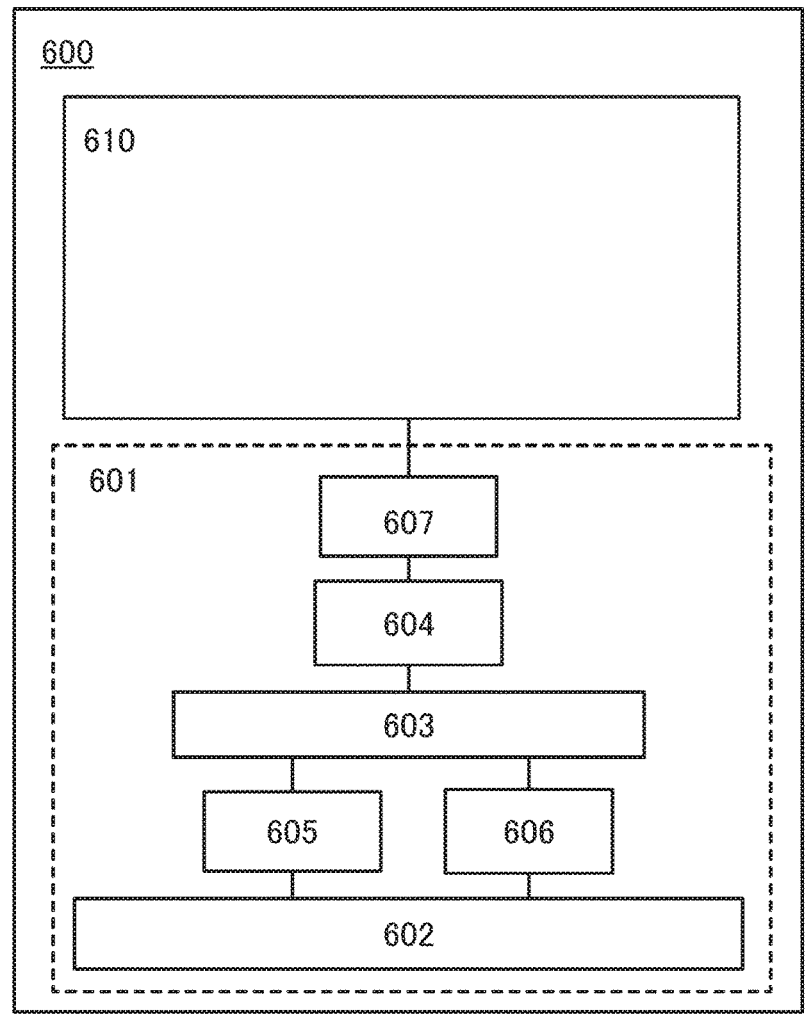
FIG. 7 shows an example of a structure of a wireless power feeding system.
Figure 7:
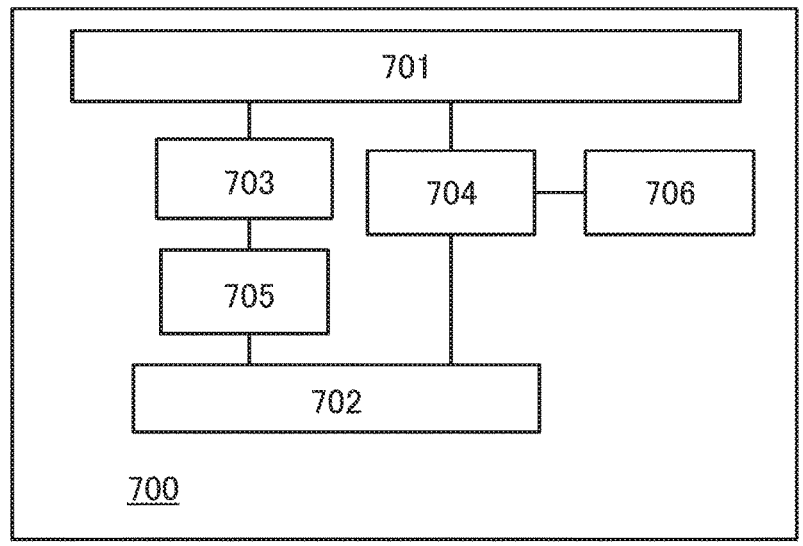

In FIG. 7, the power receiving device 600 includes the power receiving device portion 601 and the power load portion 610. The power receiving device portion 601 includes at least the power receiving device antenna circuit 602, the signal processing circuit 603, the lithium ion secondary battery 604, a rectifier circuit 605, a modulation circuit 606, and a power supply circuit 607. In addition, the power feeding device 700 includes at least the power feeding device antenna circuit 701, the signal processing circuit 702, a rectifier circuit 703, a modulation circuit 704, a demodulation circuit 705, and an oscillator circuit 706.

The power receiving device antenna circuit 602 has a function of receiving a signal transmitted by the power feeding device antenna circuit 701 and transmitting a signal to the power feeding device antenna circuit 701. In the case where the power receiving device antenna circuit 602 receives a signal transmitted by the power feeding device antenna circuit 701, the rectifier circuit 605 has a function of generating DC voltage from the signal received by the power receiving device antenna circuit 602. The signal processing circuit 603 has a function of processing a signal received by the power receiving device antenna circuit 602 and controlling charge of the lithium ion secondary battery 604 and supply of electric power from the lithium ion secondary battery 604 to the power supply circuit 607. The power supply circuit 607 has a function of converting voltage stored in the lithium ion secondary battery 604 into voltage needed for the power load portion 610. The modulation circuit 606 is used when a certain response is transmitted from the power receiving device 600 to the power feeding device 700.

With the power supply circuit 607, electric power supplied to the power load portion 610 can be controlled. Thus, overvoltage application to the power load portion 610 can be inhibited, and deterioration or breakdown of the power receiving device 600 can be inhibited.

In addition, with the modulation circuit 606, a signal can be transmitted, from the power receiving device 600 to the power feeding device 700. Therefore, when the amount of charged power in the power receiving device 600 is detected and a certain amount of power is charged, a signal is transmitted from the power receiving device 600 to the power feeding device 700 so that power feeding from the power feeding device 700 to the power receiving device 600 can be stopped. As a result, the lithium ion secondary battery 604 is not fully charged, so that the number of charge cycles of the lithium ion secondary battery 604 can be increased.

The power feeding device antenna circuit 701 has a function of transmitting a signal to the power receiving device antenna circuit 602 and receiving a signal from the power receiving device antenna circuit 602. When a signal is transmitted to the power receiving device antenna circuit 602, the signal processing circuit 702 generates a signal which is transmitted to the power receiving device. The oscillator circuit 706 is a circuit which generates a signal with a constant frequency. The modulation circuit 704 has a function of applying voltage to the power feeding device antenna circuit 701 in accordance with the signal generated by the signal processing circuit 702 and the signal with a constant frequency generated by the oscillator circuit 706. Thus, a signal is output from the power feeding device antenna circuit 701. On the other hand, when a signal is received from the power receiving device antenna circuit 602, the rectifier circuit 703 has a function of rectifying, the received signal. From signals rectified b the rectifier circuit 703, the demodulation circuit 705 extracts a signal transmitted from the power receiving device 600 to the power feeding device 700. The signal processing circuit 702 has a function of analyzing the signal extracted the demodulation circuit 705.

Note that any circuit may be provided between the circuits as long as the RF power feeding can be performed. For example, after the power receiving device $00 receives a signal and the rectifier circuit 605 generates DC voltage, a circuit such as a DC-DC converter or regulator that is provided in a subsequent stage may generate constant voltage. Thus, overvoltage application to the inside of the power receiving device 600 can be inhibited.

The lithium ion secondary battery according to one embodiment of the present invention is used as the lithium ion secondary battery 604 included in the power receiving device 600 in the RF power feeding system shown in FIG. 7.

With the use of the lithium ion secondary battery according to one embodiment of the present invention in the RF power feeding system, the discharge capacity or the charge capacity can be increased as compared with that of a conventional lithium ion secondary battery; therefore, the time interval of the wireless power feeding can be longer, so that power feeding can be less frequent.

In addition, by using the lithium ion secondary battery according to one embodiment of the present invention in the RF power feeding system, the power receiving device 600 can be compact and lightweight if the discharge capacity or the charge capacity with which the power load portion 610 can be driven is the same as that of a conventional lithium ion secondary battery. Therefore, the total cost can be reduced.

Note that when the lithium ion secondary battery according to one embodiment of the present invention is used in the RF power feeding system and the power receiving device antenna circuit 602 and the lithium ion secondary battery 604 overlap with each other, it is preferred that the impedance of the power receiving device antenna circuit 602 is not changed by deformation of the lithium ion secondary battery 604 due to charge and discharge of the lithium ion secondary battery 604 and deformation of an antenna due to the above deformation. If the impedance of the antenna is changed, in some cases, electric power is not supplied sufficiently. For example, the lithium ion secondary battery 604 may be placed in a battery pack formed of metal or ceramics. Note that in that case, the power receiving device antenna circuit 602 and the battery pack are preferably separated from each other by several tens of micrometers or more.

In this embodiment, the signal for charge has no limitation on its frequency and may have any hand of frequency with which electric power can be transmitted. For example, the signal for charge may have any of an LF band of 135 kHz (long wave), an HF band of 13.56 MHz (short wave), a UHF band of 900 MHz to 1 GHz (ultra high frequency wave), and a microwave band of 2.45 GHZ.

A signal transmission method may be properly selected from various methods including an electromagnetic coupling method, an electromagnetic induction method, a resonance method, and a microwave method. In order to prevent energy loss due to foreign substances containing moisture, such as rain and mud, the electromagnetic induction method or the resonance method using a low frequency band, specifically, frequencies of short waves of from 3 MHz to 30 MHz, frequencies of medium waves of from 300 kHz to 3 MHz, frequencies of long waves of from 30 kHz to 300 kHz, or frequencies of ultra long waves of from 3 kHz to 30 kHz, is preferably used.

This embodiment can be implemented in combination with any of the above-described embodiments.

This application is based on Japanese Patent Application serial No. 2011-060197 filed with Japan Patent Office on Mar. 18, 2011, the entire contents of which are hereby incorporated by reference.

What is claimed is:

1. A method for manufacturing a lithium ion secondary battery, comprising the steps of:
    applying a slurry including a plurality of single crystal particles to an upper surface of a positive electrode current collector, wherein each of the single crystal particles is a lithium-containing composite oxide, and wherein in each of the single crystal particles, a length in a b-axis direction is shorter than each of lengths in an a-axis direction and a c-axis direction; and
    exerting pressure on the slurry so that a b-axis of each of the single crystal particles intersects with the upper surface of the positive electrode current collector,
    wherein the lithium-containing composite oxide is expressed by $LiMPO_4$ (M is one or more of Fe (II), Mn (II), Co (II), and Ni (II)) that is a general formula, and
    wherein a ratio of lengths of the single crystal particles in the a-axis direction and the c-axis direction is greater than or equal to 0.8 and less than or equal to 1.2.

2. The method for manufacturing a lithium ion secondary battery, according to claim 1, wherein each length in the b-axis direction of the single crystal particles is greater than or equal to 5 nm and less than or equal to 50 nm.

3. The method for manufacturing a lithium ion secondary battery, according to claim 1, wherein the b-axis of each of the single crystal particles intersects with the upper surface of the positive electrode current collector at an angle greater than or equal to 60 degrees and less than or equal to 90 degrees.

4. The method for manufacturing a lithium ion secondary battery, according to claim 1, wherein at least one of the single crystal particles is overlapped with at least another one of the single crystal particles.

5. The method for manufacturing a lithium ion secondary battery, according to claim 1, wherein the lithium-containing composite oxide has an olivine structure.

6. The method for manufacturing a lithium ion secondary battery, according to claim 1, wherein each of the single crystal particles is a flat single crystal particle.

7. The method for manufacturing a lithium ion secondary battery, according to claim 1, wherein the step of exerting pressure on the slurry is a step of moving a roller over the slurry.

8. The method for manufacturing a lithium ion secondary battery, according to claim 1,
    wherein, in each of the single crystal particles, a b-plane has a square shape or a substantially square shape.

9. A method for manufacturing a lithium ion secondary battery, comprising the steps of:
    applying a slurry including a plurality of single crystal particles to an upper surface of a positive electrode current collector, wherein each of the single crystal particles is a lithium-containing composite oxide, and wherein in each of the single crystal particles, a length in a b-axis direction is shorter than each of lengths in an a-axis direction and a c-axis direction; and
    transmitting vibration to the slurry so that a b-axis of each of the single crystal particles intersects with the upper surface of the positive electrode current collector,
    wherein the lithium-containing composite oxide is expressed by $LiMPO_4$ (M is one or more of Fe (II), Mn (II), Co (II), and Ni (II)) that is a general formula, and
    wherein a ratio of lengths of the single crystal particles in the a-axis direction and the c-axis direction is greater than or equal to 0.8 and less than or equal to 1.2.

10. The method for manufacturing a lithium ion secondary battery, according to claim 9, wherein each length in the b-axis direction of the single crystal particles is greater than or equal to 5 nm and less than or equal to 50 nm.

11. The method for manufacturing a lithium ion secondary battery, according to claim 9, wherein the b-axis of each of the single crystal particles intersects with the upper surface of the positive electrode current collector at an angle greater than or equal to 60 degrees and less than or equal to 90 degrees.

12. The method for manufacturing a lithium ion secondary battery, according to claim 9, wherein at least one of the single crystal particles is overlapped with at least another one of the single crystal particles.

13. The method for manufacturing a lithium ion secondary battery, according to claim 9, wherein the lithium-containing composite oxide has an olivine structure.

14. The method for manufacturing a lithium ion secondary battery, according to claim 9, wherein each of the single crystal particles is a flat single crystal particle.

15. The method for manufacturing a lithium ion secondary battery, according to claim 9, wherein the step of transmitting vibration to the slurry is a step of transmitting ultrasonic vibration to the slurry.

16. The method for manufacturing a lithium ion secondary battery, according to claim 9,
    wherein, in each of the single crystal particles, a b-plane has a square shape or a substantially square shape.

* * * * *